United States Patent [19]

Oikawa et al.

[11] Patent Number: 5,707,784
[45] Date of Patent: Jan. 13, 1998

[54] METHOD OF FORMING CHEMICALLY AMPLIFIED RESIST PATTERN AND MANUFACTURING FOR SEMICONDUCTOR DEVICE BY USING THE CHEMICALLY AMPLIFIED RESIST PATTERN

[75] Inventors: Akira Oikawa; Hiroyuki Tanaka, both of Kawasaki; Masayuki Oie, Tokyo; Hideyuki Tanaka, Tokyo; Nobunori Abe, Tokyo, all of Japan

[73] Assignees: Fujitsu Ltd., Kawasaki; Nippon Zeon Co., Ltd., Tokyo, both of Japan

[21] Appl. No.: 567,210

[22] Filed: Dec. 5, 1995

Related U.S. Application Data

[63] Continuation of Ser. No. 121,645, Sep. 16, 1993, abandoned.

[30] Foreign Application Priority Data

Sep. 16, 1992 [JP] Japan ................................. 4-246734

[51] Int. Cl.[6] ........................................................ G03C 5/00
[52] U.S. Cl. ........................ 430/313; 430/311; 430/330; 430/325; 430/326; 430/273.1; 430/271.1
[58] Field of Search ........................... 430/311, 330, 430/313, 325, 326, 273.1, 271.1, 961

[56] References Cited

U.S. PATENT DOCUMENTS

| 4,647,598 | 3/1987 | Yada et al. ................................. 522/3 |
| 5,178,989 | 1/1993 | Heller et al. ............................ 430/323 |
| 5,326,675 | 7/1994 | Niki et al. ............................... 430/330 |

FOREIGN PATENT DOCUMENTS

| 4-204848 | 7/1992 | Japan . |
| 4204848 | 7/1992 | Japan . |
| 4-221814 | 8/1992 | Japan . |
| 04342260 | 11/1992 | Japan . |

OTHER PUBLICATIONS

Oikawa et al. Effect of using a resin coating on KrF chemically amplified positive resists, Proc. SPIE–Int. Soc. Opt. Eng. (1993), vol. 1925, pp. 92–100.

*Primary Examiner*—George F. Lesmes
*Assistant Examiner*—Laura Weiner
*Attorney, Agent, or Firm*—Staas & Halsey

[57] ABSTRACT

A chemically amplified resist pattern is formed by applying chemically amplified resist, forming thereafter a layer of an amorphous polyolefines substance thereon, then exposing the chemically amplified resist, and furthermore, developing the chemically amplified resist after removing the amorphous polyolefines substance.

13 Claims, 7 Drawing Sheets

(0.45μm L&S) CHEMICALLY AMPLIFIED RESIST (0.40μm L&S)

(0.35μm L&S)

(0.30μm L&S)

(0.25μm L&S)

(0.45μm L&S) CHEMICALLY AMPLIFIED RESIST (0.40μm L&S)

(0.35μm L&S)

(0.30μm L&S)

METHOD OF FORMING CHEMICALLY AMPLIFIED RESIST PATTERN AND MANUFACTURING FOR SEMICONDUCTOR DEVICE BY USING THE CHEMICALLY AMPLIFIED RESIST PATTERN

This application is a continuation of Ser. No. 08/121,645 filed Sep. 16, 1993, now abandoned

BACKGROUND OF THE INVENTION

1. Field of the Invention

The present invention relates to a method of forming a chemically amplified resist pattern, and more specifically to a method of forming a chemically amplified resist pattern used in forming a pattern of a semiconductor device such as an LSI, a VLSI or the like. As the patterning of semiconductor integrated circuits becomes finer so as to densify the package, closely controlled properties are also required for the resist materials used in the formation of the pattern. Thus, chemically amplified resists are attracting attention as materials developed for complying with all of the requests for resolution, sensitivity and dry etching resistance.

2. Description of the Related Art

In case of applying patterning to a film composed of semiconductor, metal or the like, resist is applied onto the film by a spin coating method, the resist is exposed by using ionizing radiation, and then the resist is developed by an alkaline solution so as to form a pattern. Thereafter, a film composed of semiconductor, metal or the like in an area uncovered with the resist pattern is etched to form the film into a pattern.

Besides, the ionizing radiation means an electromagnetic wave such as visible radiation, ultraviolet radiation and X-rays or corpuscular rays such as an electron beam and an ion beam, and no reticule is used in general in the case of exposure using corpuscular rays.

Now, a material obtained by adding a large amount of sensitized materials of a diazonaphtoquinone group to, for example, novolak which is polymer and performing intermolecular bonding thereof, thereby to control alkali solubility of novolak, is used as a material for positive resist. When an i beam or a g beam is radiated to the resist, the structure of diazonaphtoquinone is changed and the intermolecular bonding thereof with novolak gets loose, thus presenting solubility of novolak.

According to such resist, however, photoabsorption by the sensitized materials is high, and the absorption becomes more conspicuous as an exposure wavelength gets shorter. Thus, it becomes difficult for the light to attain to a lower part of resist $R_1$ as shown in FIG. 1, thus lowering precision of the pattern.

On the other hand, chemically amplified resists achieve an alkali soluble state by incorporation of an acid group ($H^+$) by irradiation with ionizing radiation with alkali soluble polymer (base resin material), as the positive material thereof. With this material, $H^+$ is generated from the PAG by irradiation with ionizing radiation, and the DI is decomposed by the acid, thus changing the state into an alkali soluble state. Besides, in the case of negative resist, a crosslinker (CL) is used in place of the DI.

Since the PAG in a quantity of 2 to 5 when the polymer is assumed to be 100 is sufficient, absorption of the ionizing radiation by the PAG is small, and moreover, the generated acid makes a large amount of polymer soluble acting as a catalyzer by heating, thus making it possible to realize high sensitivity.

In patterning of such chemically amplified resist, the chemically amplified resist is applied first onto an insulating film, a semiconductor film, a metallic film or the like and a first heat treatment (prebake) is applied thereon, and then exposure is performed using ionizing radiation, an acid is generated only at a part irradiated with ionizing radiation.

Further, when a second heat treatment (post exposure bake) is performed after exposure, the acid contained in the chemically amplified resist acts as a catalyzer so as to make the polymer soluble, thus making it possible to realize high sensitivity. Then, the chemically amplified resist is developed after the heat treatment.

In this method of forming a pattern, however, the portion of the chemically amplified resist neighboring to the surface thereof may become insoluble due to the influence of impurities such as amine in the ambience during irradiation with ionizing radiation or the second heat treatment. When a section of a part irradiated with ionizing radiation in the chemically amplified resist complete with exposure and development is observed, such problems are noticed that a projecting canopy is generated in a hole H at the upper part of resist $R_2$ as shown in FIG. 2, or a part where no pattern is formed is produced in resist $R_3$ as shown in FIG. 3.

Besides, as shown in FIG. 2, in case of a positive resist a section of an opening becomes a reverse taper shape after developing not to give a perfect patterning.

In case of a negative resist the thickness of resist reduce considerably while developing. Therefor patterning becomes difficult notwithstanding that the resist is negative or positive.

As against the above, it has been proposed to form a covering layer on the surface of the positive chemically amplified resist to isolate from the ambience.

Besides, a use of polymethylsilsesquioxane as a covering layer has been proposed in Japanese Patent Application by FUJITSU LIMITED of Mar. 18, 1992 (unopened) and a synthesis of polymethylsilsesquioxane has been proposed in U.S. Pat. No. 4,670,299 (1987). However, this material is liable to degenerate.

Further, it is described to use water soluble high polymer resin as a covering layer of chemically amplified resist in the Japanese Patent Provisional Publication No. 4-204848 and the Japanese Patent Provisional Publication No. 4-221814. Since this material of the covering layer has polarity, it is easy to absorb a polar substance such as water and ammonium. Therefore the polar substance gives the bad effect at the surface of the chemically amplified resist, and the functional performance as a covering layer is not displayed fully.

SUMMARY OF THE INVENTION

It is an object of the present invention to provide a method of forming a chemically amplified resist pattern which increases precision of a pattern and improves resolution.

According to the present invention, a covering layer composed of an amorphous polyolefin is formed after applying the chemically amplified resist.

The amorphous polyolefin are used for the purpose of isolating the chemically amplified resist from the ambience therearound. It has high transparency for the exposure wavelength, is non-polar, has hydrophobicity, is superior in forming performance of a covering layer, and does not pass impurities contained in the ambience. Further, the amorphous polyolefin is chemically stable and does not react on amine or the like in the ambience. Therefore, it neither changes until the end of exposure after being applied nor degrades precision of the pattern of the exposed chemically amplified resist. Moreover, it is influenced neither by irradiation with ionizing radiation nor by the chemically amplified resist and the ambience during heat treatment, and no refractory part is produced on the surface thereof.

As a result, the pattern precision of the chemically amplified resist is increased and the resolution is improved.

DESCRIPTION OF THE PREFERRED EMBODIMENTS

A process of forming a chemically amplified resist pattern according to the present invention will be described based on FIG. 4A to FIG. 4D.

Figure 4A:
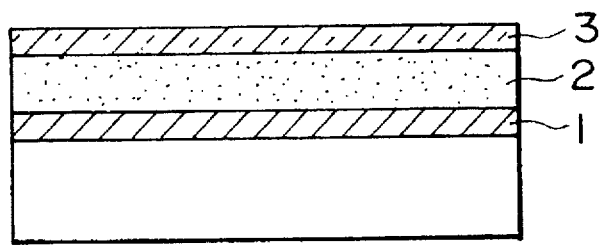
FIG. 4A to FIG. 4D are sectional views showing a patterning process by principle of chemically amplified resist according to an embodiment of the present invention.

First, as shown in FIG. 4A, after chemically amplified resist 2 is applied onto a foundation layer 1 like a substrate or a film, liquefied substance 3 composed of an amorphous polyolefin is applied thereto. These applications are performed by a spin coating method.

Next, the chemically amplified resist and the amorphous polyolefin substance are heated at a prebaking temperature of the chemically amplified resist Besides, a process of prebaking the chemically amplified resist 2 may be added prior to applying the amorphous polyolefin substance 3, however conspicuous effects by the above have not been discovered.

Figure 4B:
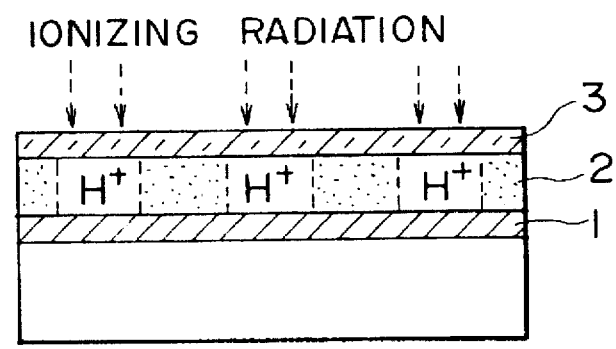

Thereafter, as shown in FIG. 4B, a latent image is formed in the layer of the chemically amplified resist 2 by exposing using ionizing radiation which transmits the amorphous polyolefin substance 3 and heating as prebaking.

Figure 4C:
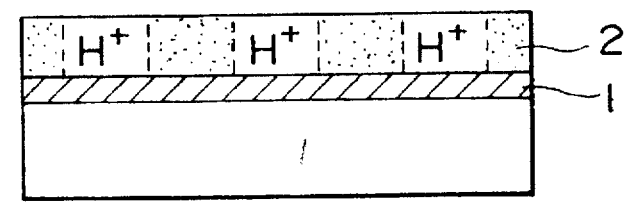
Figure 4D:
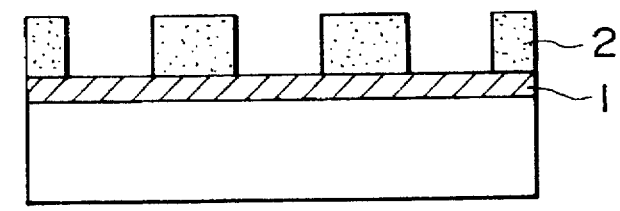
Figure 5:
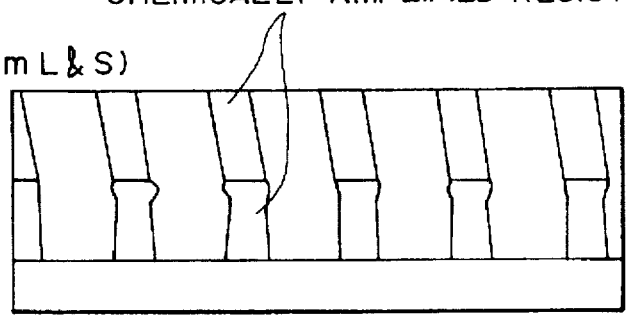
FIG. 5 to FIG. 9 are sectional views showing a chemically amplified resist pattern of lines and spaces having different widths formed according to an embodiment of the present invention.
Figure 6:
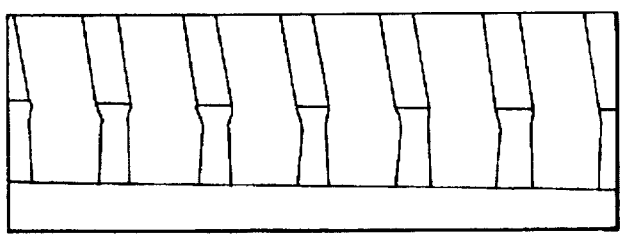
Figure 7:
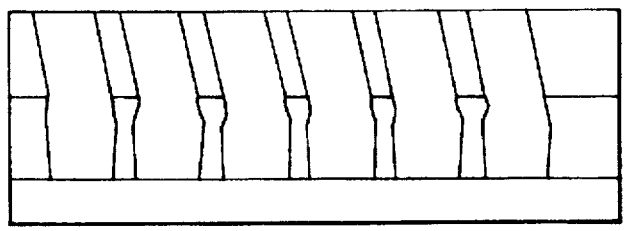
Figure 8:
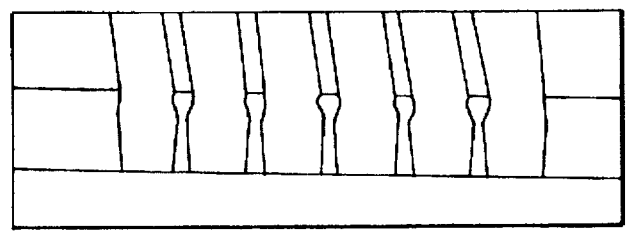
Figure 9:
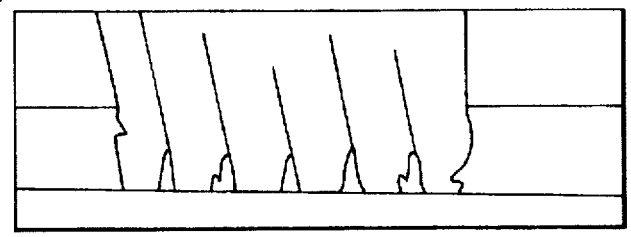

Then, the amorphous polyolefin substance 3 is removed and the chemically amplified resist 2 is developed as shown in FIG. 4C, thereby to form a pattern of the chemically amplified resist 2 such as shown in FIG. 4D.

Thereafter, although it is not shown in the figures, the foundation layer of a part which is not covered by the pattern of the chemically amplified resist is etched so as to get patterning of the foundation layer.

In the process of patterning the chemically amplified resist described above, the amorphous polyolefin substance 3 is used for the purpose of isolating the chemically amplified resist 2 from the ambience therearound.

The amorphous polyolefin substance has high transparency for exposure wavelength, is non-polar, has hydrophobicity, is superior in forming performance of a covering layer, and does not have impurities contained in the ambience transmit therethrough. Further, since the amorphous polyolefin substance is chemically stable, and moreover, does not react on amine or the like in the ambience, it is not changed until the end of exposure after being applied, and does not degrade pattern precision of the exposed chemically amplified resist. Moreover, it is not affected by the chemically amplified resist or the ambience during irradiation with ionizing radiation and heat treatment, and does not produce a refractory part on the surface of the chemically amplified resist.

The amorphous polyolefin substances are not limited specifically as far as they are an amorphous substance of polyolefin, and various types of substances are applicable.

For example, amorphous polyolefin substance may be a polymer or a copolymer of any of alkenes, cycloalkenes, perfluoroalkenes, perfluorocycloalkenes, alkadienes, cycloalkadienes, perfluoroalkadienes or perfluorocycloalkadienes. Alternatively the amorphous polyolefin substance may be a hydrogenated substance, a halide or a cyanide of the polymer or the copolymer Furthermore, hydrogenated open-circle polymers of cycloalkenes, addition polymers of cycloalkenes and alkenes, or addition polymers of cycloalkenes and α-olefines are more preferable.

The covering layer composed of these compounds is superior in application performance, has transmittance for ultraviolet radiation at 95% or higher in case of a film thickness of approximately 1 μm, has an water absorption coefficient as low as 0.01% or lower, and is removable with widely used solvent, thus being advantageous as a protective film of a chemically amplified resist.

A method of peeling off the amorphous polyolefin substance is not limited in particular, but it is preferable that the amorphous polyolefin substance can be removed easily with widely used solvents or the like, and various substances are applicable.

As the solvent, for example, aliphatic hydrocarbons such as n-hexane, cyclohexane, n-heptane, methylcyclohexane, n-octane, isooctane, n-decane, decalin, and ligroin, aromatic hydrocarbons such as benzene, toluene, xylene, ethylbenzene, isopropylbenzene and diethylbenzene, halogenated hydrocarbons such as carbon tetrachloride, chloroform, trichloroethane, chlorobenzene and dichlorobenzene, ethers such as tetrahydrofuran, ethylether, butylether, anisole and isopropylether, or carbons fluoride such as perfluoropentane, perfluorohexane and triperfluorobutylamine are available. Besides, these solvents may be used both independently and in a mixture system.

Examples of chemically amplified resist materials will be given. A first resist composition principally contains ① a compound which reacts in the presence of an acid to form an alkali soluble phenol resin, ② a compound for generating an acid or a compound for promoting generation of an acid (acid generating agent) by irradiation with ionizing radiation and ③ a solvent, and, as occasion demands, further contains an additive for improving functions such as a surface active agent, a preservation stabilizer and a striation inhibitor. A second resist composition principally contains ① an alkali soluble phenol resin, ② a compound which functions as an acid generating agent so as to make the resin alkali insoluble and to lose this function when an acid is present, ③ an alkali soluble resin and ④ a solvent, and further contains, as occasion demands, an additive for improving additive functions such as a surface active agent, a preservation stabilizer and a striation inhibitor.

The term "per" included in the name of the abovementioned substances indicates that hydrogen of a hydrocarbon is all replaced with other elements, and perfluoropentane for instance means dodecafluoropentane in which all of the hydrogen is replaced with fluorine.

Cases where a chemically amplified resist pattern is formed by applying an amorphous polyolefin substance on a chemically amplified resist have been compared with cases where a chemically amplified resist pattern is formed without using an amorphous polyolefin substance by testing. These tests show that patterns of chemically amplified resist having a thickness of 6,900 Å can be obtained. In these tests, the chemically amplified resists have been patterned under the same conditions except that in some cases an amorphous polyolefin substance has been used and in other cases it has not.

FIG. 5 to FIG. 9 show cases when an amorphous polyolefin substance is used, and FIG. 10 to FIG. 13 show cases when an amorphous polyolefin substance is not used. These figures have been drawn based on the images in sectional photographs obtained by a scanning electron microscope.

As it is also apparent from FIG. 5 to FIG. 9, when an amorphous polyolefin substance was used, no canopy was formed on the edge of the line and space (hereinafter referred to as L & S) pattern of the chemically amplified resist, and an undeveloped part was not produced.

Figure 10:
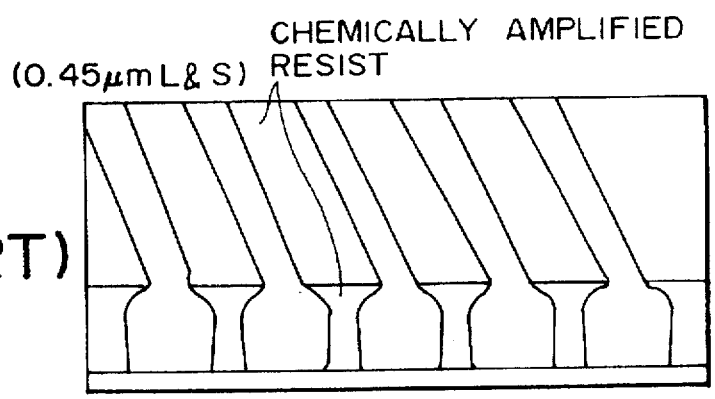
FIG. 10 to FIG. 13 are sectional views showing a chemically amplified resist pattern of lines and spaces having different widths formed by a conventional method.
Figure 11:
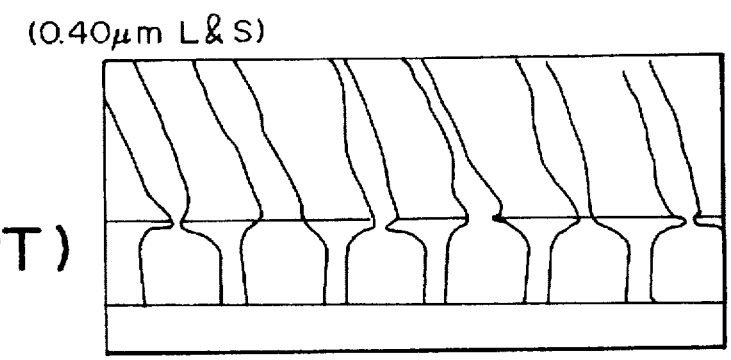
Figure 12:
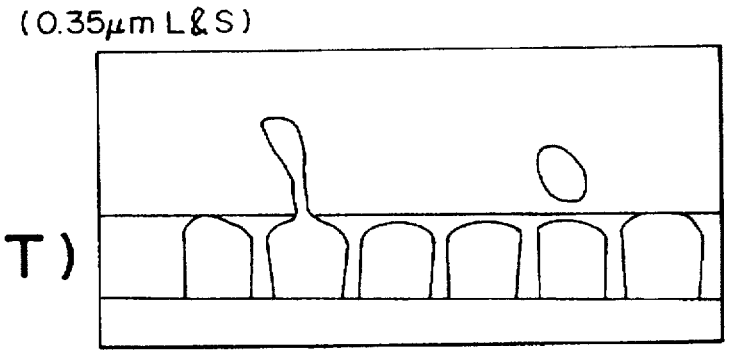
Figure 13:
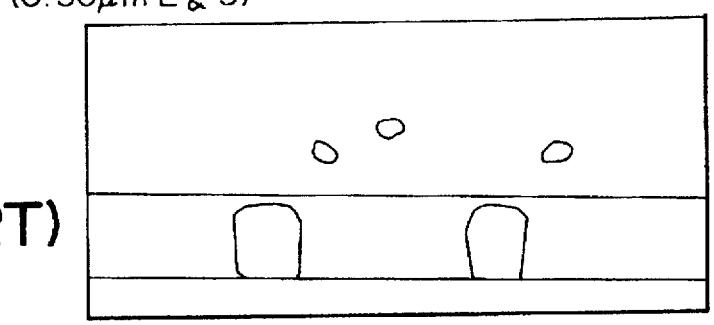

As against the above, when a covering layer of an amorphous polyolefin substance was not used, canopies were formed on the edges of L & S patterns having widths of 0.45 μm and 0.40 μm of the chemically amplified resist as shown in FIG. 10 and FIG. 11. Further, in the L & S pattern having a narrower width than the above, undeveloped parts were existent as shown in FIG. 12 and FIG. 13.

Figure 14:
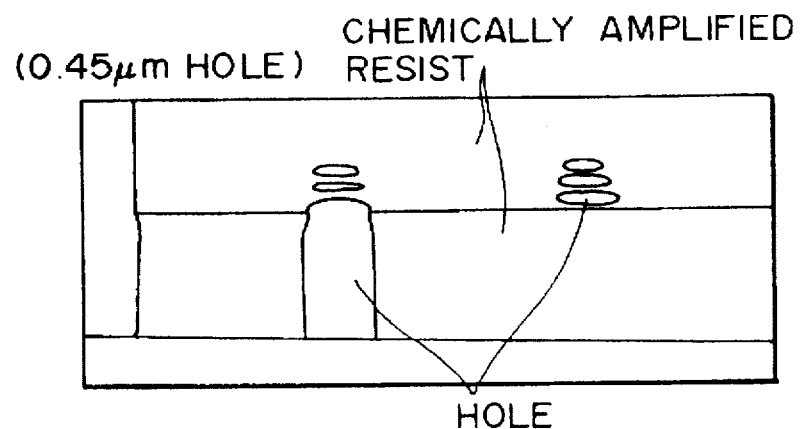
FIG. 14 and FIG. 15 are sectional views showing holes having different diameters formed in a chemically amplified resist according to an embodiment of the present invention.
Figure 15:
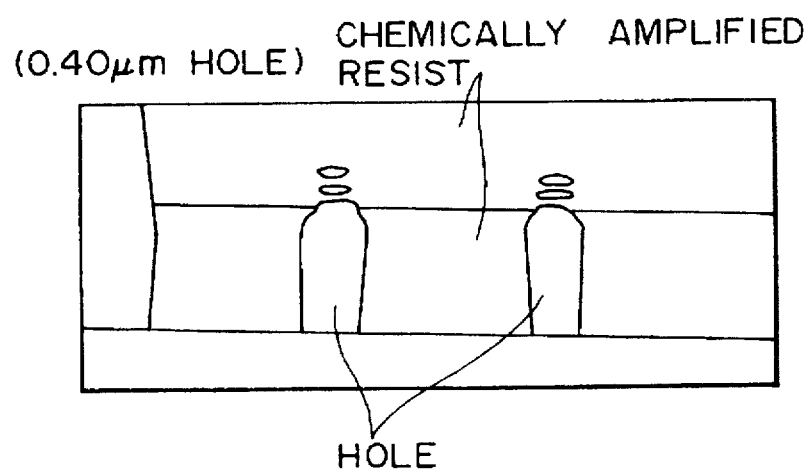

Further, when holes were formed in the chemically amplified resist using an amorphous polyolefin substance in a covering layer, they were formed as shown in FIG. 14 and FIG. 15, and no canopy was formed in these holes. These figures have been drawn based on images of sectional photographs obtained by a scanning electron microscope.

Next, a process of forming a chemically amplified resist pattern of the present embodiment will be described with reference to more concrete examples.

(First Example)

FIG. 16A to FIG. 16H are sectional views showing a first example of a process of forming a chemically amplified resist pattern of the present invention.

Figure 16A:
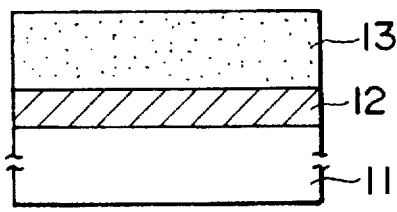
FIG. 16A to FIG. 16H are sectional views showing a first process of forming a chemically amplified resist pattern showing the embodiment of the present invention further concretely.
Figure 16B:
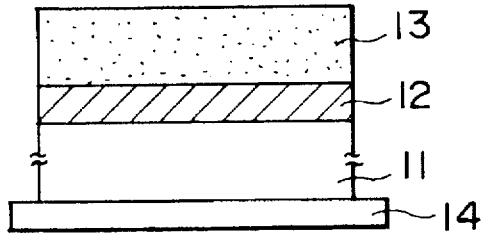

First, as shown in FIG. 16A, positive chemically amplified resist 13 is coated with spinner in a thickness of approximately 0.7 μm on a foundation film 12 such as semiconductor and metal laminated on a silicon substrate 11, and then, prebaking is performed at 90° C. for 90 seconds on a hot plate 14 as shown in FIG. 16B.

Besides, a substance containing ① a compound in which 40% of a polyvinylphenol hydroxyl group is formed into t-butoxycarbonyloxy, ② triphenylsulfoniumtriphlate and ③ ethyl lactate in principal is used as the material of positive chemically amplified resist 13.

Figure 16C:
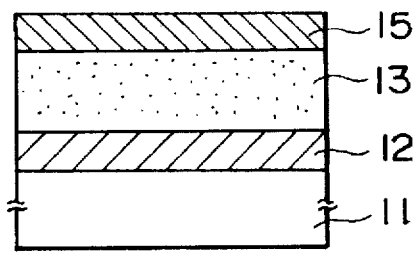

Next, as shown in FIG. 16C, a covering layer 15 composed of a hydrogenated substance of a copolymer of methyltetracyclododecene and methylnorbornene is coated with spinner in a thickness of approximately 1.0 μm on the chemically amplified resist 13.

Figure 16D:
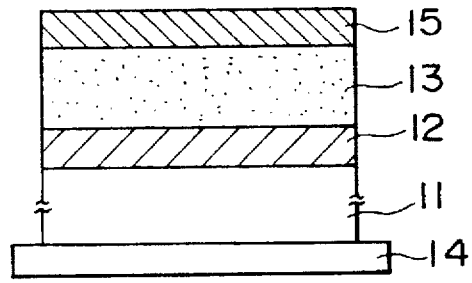

Thereafter, prebaking is performed at 90° C. for 90 seconds in the hot plate 14 as shown in FIG. 16D.

Figure 16E:
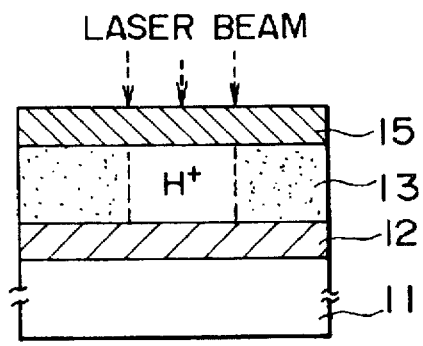
Figure 16F:
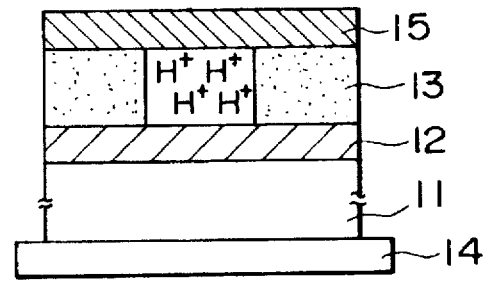

Thereafter, as shown in FIG. 16E, the chemically amplified resist 13 is exposed with a KrF laser beam having a wavelength of 248 nm using a reticule (not illustrated), thereby to form a latent image pattern. Then, as shown in FIG. 16F, heat treatment is performed immediately thereafter at 90° C. for 60 seconds on the hot plate 14. The covering layer 15 is stable up to the exposure, and there is no problem about the exposure.

Figure 16G:
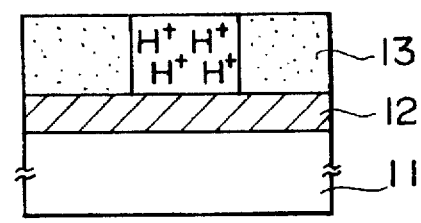
Figure 16H:
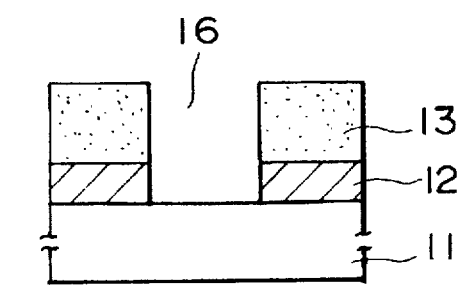

Next, the covering layer is peeled off by xylene as shown in FIG. 16G, and then, as shown in FIG. 16H, a paddle development was performed for 60 seconds by a 2.38% tetramethylammoniumhydroxide (TMAH) aqueous solution so as to make the latent image pattern visible.

When the section of the sample was observed, it was noticed that no canopy was left in a groove 16 applied with patterning as shown in FIG. 16H, and the surface refractory layer of the chemically amplified resist 13 was not conspicuous.

Besides, after patterning of the chemically amplified resist 13 described above is completed, the exposed foundation film 12 is removed by etching.

(Second Example)

FIG. 17A to FIG. 17H are sectional views showing a second example of a process of forming a chemically amplified resist pattern of the present invention.

Figure 17A:
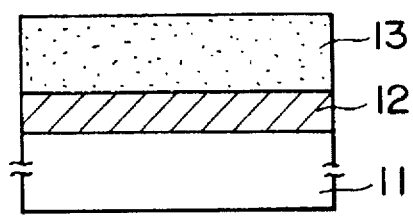
FIG. 17A to FIG. 17H are sectional views showing a second process of forming a chemically amplified resist pattern showing the embodiment of the present invention further concretely.
Figure 17B:
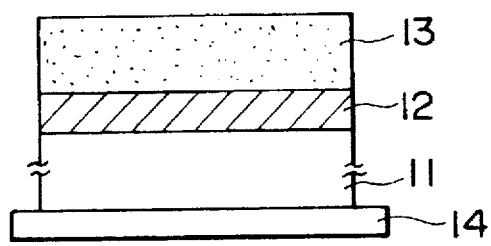

First, as shown in FIG. 17A, after the positive chemically amplified resist 13 same as that in the first embodiment is applied in a thickness of approximately 0.7 μm on the foundation film 12 such as semiconductor and metal laminated on the silicon substrate 11, prebaking is performed at 90° C. for 90 seconds on the hot plate 14 as shown in FIG. 17B.

Figure 17C:
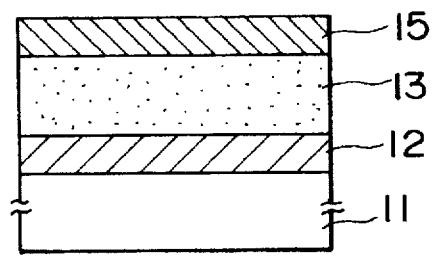

Then, as shown in FIG. 17C, a covering layer 15 composed of a hydrogenated substance of a copolymer of methyltetracyclododecene and methylnorbornene is coated in a thickness of approximately 1.0 μm.

Figure 17D:
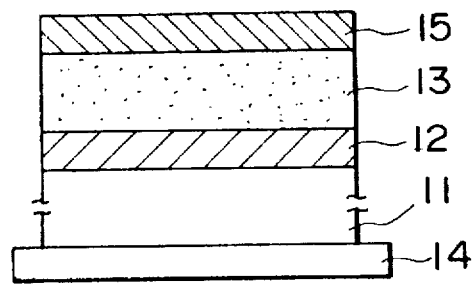

Thereafter, as shown in FIG. 17D, the silicon substrate 11 is placed on the hot plate 14, and prebaking is performed at 90° C. for 90 seconds.

Figure 17E:
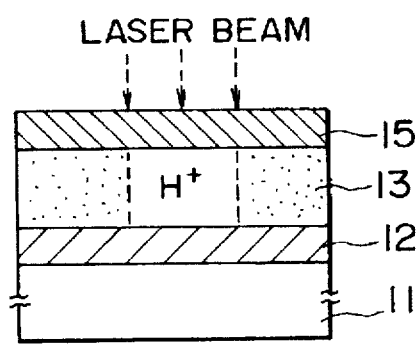
Figure 17F:
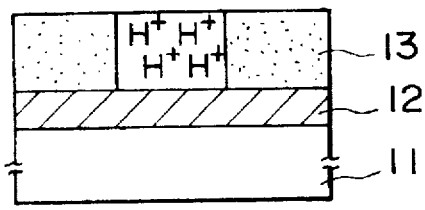
Figure 17G:
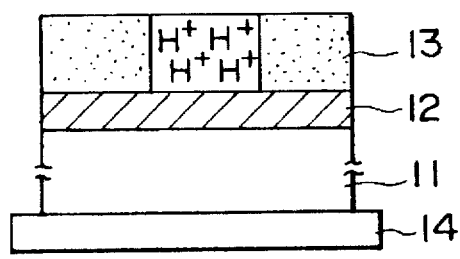

Next, as shown in FIG. 17E, the chemically amplified resist 13 is exposed by a KrF laser beam having a wavelength of 248 nm using a reticule (not illustrated). After exposure, as shown in FIG. 17F, the covering layer 15 on the chemically amplified resist 13 is peeled off by xylene, and heat treatment is applied thereafter at 90° C. for 60 seconds on the hot plate 14 as shown in FIG. 17G.

It was seen that the covering layer 15 was chemically stable until it was peeled off, the surface thereof did not change, and did not constitute a hindrance at time of exposure.

Figure 17H:
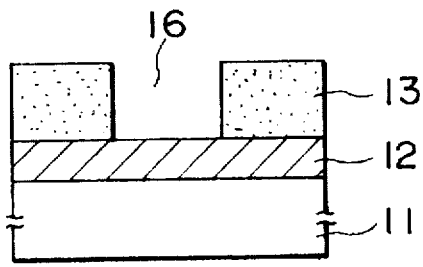

Then as shown in FIG. 17H, when the section of a sample was observed after performing paddle development for 60 seconds by a 2.38% TMAH aqueous solution, it was seen that no canopy was left in the groove 16 applied with patterning and the surface refractory layer of the chemically amplified resist 13 was not conspicuous.

As against the above, such a result as described hereunder was obtained when patterning was applied to the chemically amplified resist 13 by a conventional method in which no covering layer is provided.

First, the positive chemically amplified resist having the same constituents was applied in the same thickness, and exposed by a KrF laser beam using a reticule after prebaking was performed at 90° C. for 90 seconds on the hot plate. Then, heat treatment was applied at 90° C. for 60 seconds on the hot plate immediately after exposure, and paddle development was performed for 60 seconds by a 2.38% TMAH aqueous solution.

Figure 1:
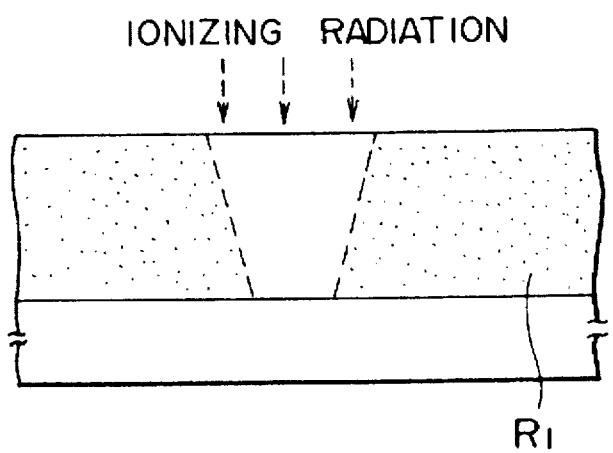
FIG. 1 is a sectional view showing an exposure state of novolak type resist.
Figure 2:
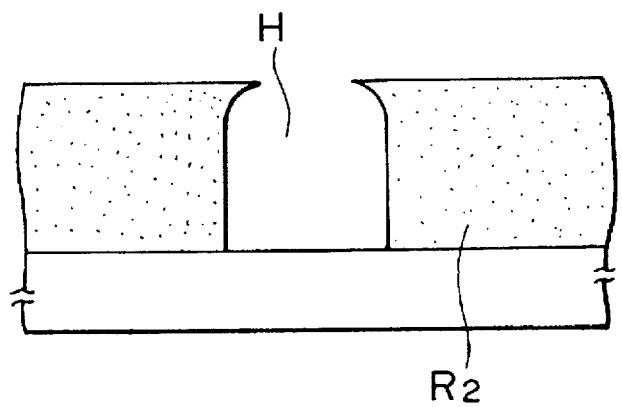
FIG. 2 is a sectional view showing a first chemically amplified resist pattern formed by a conventional method.
Figure 3:
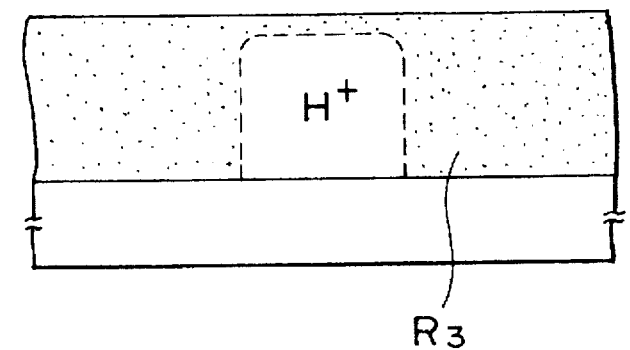
FIG. 3 is a sectional view showing a second chemically amplified resist pattern formed by a conventional method.

Then, when the section of the chemically amplified resist was observed, it was found that a reverse taper portion in a canopy form as shown in FIG. 2 was existent to an extent of being conspicuous in a hole H formed there.

(Third Example)

Next, a third embodiment of a process of patterning a chemically amplified resist will be described. Since the process is similar to that shown in FIG. 16A to FIG. 16H, description will be made with reference to those drawings.

First, as shown in FIG. 16A, after the positive chemically amplified resist 13 is applied in a thickness of approximately 0.7 μm on the foundation layer 12 such as substrate and metal laminated on the silicon substrate 11, prebaking is performed at 90° C. for 90 seconds on the hot plate 14 as shown in FIG. 16B.

This positive chemically amplified resist 13 is a composition substance containing ① a compound in which 40% of a hydroxyl group of polyvinylphenol is formed into t-butoxycarbonyloxy, ② p-toluenesulfonic acid phenylester and ③ ethyl lactate.

Thereafter, a covering layer 15 composed of a copolymer of methylnorbornene and ethylene is applied in a thickness of approximately 1.0 μm onto the chemically amplified resist 13 as shown in FIG. 16C, and prebaking is performed thereafter at 90° C. for 90 seconds on the hot plate 14 as shown in FIG. 16D.

Next, as shown in FIG. 16E, the chemically amplified resist 13 is exposed by a KrF laser beam using a reticule (not illustrated). As shown in FIG. 16F and FIG. 16G, heat treatment is applied immediately thereafter at 110° C. for 60 seconds on the hot plate 14, and then the covering layer 15 on the chemically amplified resist 13 is peeled off by xylene.

This covering layer 15 was stable until it was peeled off, and the surface thereof did not change, thus constituting no hindrance in the exposure.

Then, paddle development was performed for 60 seconds by a 2.38% TMAH aqueous solution.

When the section of the sample was observed, it appeared as shown in FIG. 16H, and it was found that no canopy was left in the groove 16 applied with patterning and the surface refractory layer was not conspicuous.

(Fourth Example)

Next, a fourth embodiment of a process of patterning a chemically amplified resist will be described. Since the process is similar to that shown in FIG. 17A to FIG. 17H, description will be made with reference to these drawings.

First, after a positive chemically amplified resist 13 same as that in the third embodiment is applied in a thickness of approximately 0.7 μm on the foundation film 12 such as semiconductor and metal laminated on a silicon substrate 11 as shown in FIG. 17A, prebaking is performed at 90° C. for 90 seconds on the hot plate 14 as shown in FIG. 17B.

Thereafter, a covering layer 15 composed of a copolymer of methylnorbornene and ethylene is applied in a thickness of approximately 1.0 μm as shown in FIG. 17C, and prebaking is performed thereafter at 90° C. for 90 seconds on the hot plate 14 as shown in FIG. 17D.

Next, the chemically amplified resist 13 is exposed by a KrF laser beam using a reticule (not illustrated) as shown in FIG. 17E. Then, immediately after the covering layer 15 on the chemically amplified resist 13 is peeled off by xylene as shown in FIG. 17F, heat treatment is applied at 110° C. for 60 seconds on the hot plate 14 as shown in FIG. 17G.

The covering layer 15 is stable until it is peeled off, and the surface thereof does not change, which constitutes no hindrance in the exposure.

Then, when paddle development was performed for 60 seconds by a 2.38% TMAH aqueous solution and the section of the chemically amplified resist 13 was observed, it was found that there were neither a canopy in the groove 16 formed by patterning nor a surface refractory layer as shown in FIG. 17H.

As against the above, the following result was obtained according to a conventional method in which a covering layer is not provided.

First, after positive chemically amplified resist having the same constituents was applied in the same thickness and then prebaking was performed at 90° C. for 90 seconds on the hot plate, the resist was exposed by a KrF laser beam using a reticule. Then, heat treatment was applied at 110° C. for 60 seconds on the hot plate immediately after exposure, and paddle development was performed for 60 seconds by a 2.38% TMAH aqueous solution.

Then, when the section of the chemically amplified resist was observed, it was found that a reverse taper portion in a canopy shape was existent in an extent of being conspicuous in the groove formed there.

(Fifth Example)

Next, a fifth embodiment of a process of patterning a chemically amplified resist will be described. Since the process is similar to that shown in FIG. 16A to FIG. 16H, description will be made with reference to these drawings.

First, as shown in FIG. 16A and FIG. 16B, after the positive chemically amplified resist 13 same as that in the first embodiment is applied in a thickness of approximately 0.7 μm on the foundation film 12 such as semiconductor and metal laminated on the silicon substrate 11, prebaking is performed at 90° C. for 90 seconds on the hot plate 14.

Furthermore, as shown in FIG. 16C, a covering layer 15 composed of a hydrogenated substance of a copolymer of methyltetracyclododecene and methylnorbornene is applied in a thickness of approximately 1.0 μm.

Thereafter, as shown in FIG. 16D, prebaking is performed at 90° C. for 90 seconds on the hot plate 14.

Next, as shown in FIG. 16E, the chemically amplified resist 13 is exposed by a KrF laser beam using a reticule (not illustrated). As shown in FIG. 16F and FIG. 16G, the covering layer 15 on the chemically amplified resist 13 is peeled off by cyclohexane after applying heat treatment at 90° C. for 60 seconds on the hot plate 14 immediately thereafter.

The covering layer 15 is stable until it is peeled off, and the surface thereof does not change, thus having constituted no hindrance in the exposure.

Then, when paddle development was performed for 60 seconds by a 2.38% TMAH aqueous solution and the section of the sample was observed, it was found that there was no canopy on the inside of the groove 16 formed by patterning as shown in FIG. 16H, and the surface refractory layer was not conspicuous.

Besides, positive chemically amplified resist has been described in the above-mentioned embodiments, but the present invention is also applicable to negative chemically amplified resist in a similar manner.

What is claimed is:

1. A method of forming a chemically amplified resist pattern comprising the steps of:
   applying a chemically amplified resist to a layer to be patterned;
   protecting the chemically amplified resist against reaction with ambient alkaline impurities by coating surface thereof with an amorphous polyolefin substance having hydrophobicity;
   heating said chemically amplified resist and said amorphous polyolefin substance together;
   forming a latent image pattern in said chemically amplified resist by exposing said chemically amplified resist to ionizing radiation which transmits through said amorphous polyolefin substance;
   removing said amorphous polyolefin substance;
   subjecting the chemically amplified resist to heat treatment either after said latent image pattern is formed or after said amorphous polyolefin substance is removed; and
   making the latent image pattern visible by developing said chemically amplified resist.

2. A method of forming a chemically amplified resist pattern according to claim 1, wherein said chemically amplified resist is heated before said amorphous polyolefin substance is coated thereon at a heating temperature which is equal to or higher than the temperature of heating said chemically amplified resist and said amorphous polyolefin substance together.

3. A method of forming a chemically amplified resist pattern according to claim 1, wherein said amorphous polyolefin substance comprises a material that is either a polymer or a copolymer of any of alkenes, cycloalkenes, alkadienes, and cycloalkadienes.

4. A method of forming a chemically amplified resist pattern according to claim 3, wherein said material comprises a hydrogenated polymer or copolymer, a halide of a polymer or copolymer, or a cyanide of a polymer or copolymer.

5. A method of forming a chemically amplified resist pattern according to claim 3, wherein said material is a hydrogenated open-circle cycloalkene polymer, an addition polymer of a cycloalkene and an alkene, or an addition polymer of cycloalkene and an α-olefin.

6. A method of forming a chemically amplified resist pattern according to claim 3, wherein said material is a hydrogenated copolymer of methyltetracyclododecene and methylnorbornene.

7. A method of forming a chemically amplified resist pattern according to claim 3, wherein said material is a copolymer of methylnorbornene and ethylene.

8. A method of forming a chemically amplified resist pattern according to claim 1, wherein a solvent is used for removing said amorphous polyolefin substance, and said solvent comprises n-hexane, cyclohexane, n-heptane, methylcyclohexane, n-octane, isooctane, n-decane, decalin, or ligroin.

9. A method of forming a chemically amplified resist pattern according to claim 1, wherein a solvent is used for removing said amorphous polyolefin substance, and said solvent comprises benzene, toluene, xylene, ethylbenzene, isopropylbenzene or diethylbenzene.

10. A method of forming a chemically amplified resist pattern according to claim 1, wherein a solvent is, used for removing said amorphous polyolefin substance, and said solvent substance comprises carbon tetrachloride, chloroform, trichloroethane, chlorobenzene or dichlorobenzene.

11. A method of forming a chemically amplified resist pattern according to claim 1, wherein a solvent is used for removing said amorphous polyolefin substance, and said solvent comprises tetrahydrofuran, ethylether, butylether, anisole or isopropylether.

12. A method of forming a chemically amplified resist pattern according to claim 1, wherein a solvent is used for removing said amorphous polyolefin substance, and said solvent comprises perfluoropentane, perfluorohexane or triperfluorobutylamine.

13. A process for manufacturing a semiconductor device using a chemically amplified resist pattern comprising the steps of:
   applying a chemically amplified resist on a layer to be patterned;
   protecting the chemically amplified resist against reaction with ambient alkaline impurities by coating a surface thereof with a liquid amorphous polyolefin substance having hydrophobicity;
   heating said chemically amplified resist and said amorphous polyolefin substance together;
   forming a latent image pattern in said chemically amplified resist by exposing said chemically amplified resist to ionizing radiation which transmits through said amorphous polyolefin substance;
   forming a pattern of said chemically amplified resist by developing said chemically amplified resist after removing said amorphous polyolefin substance; and
   forming a pattern of the layer to be patterned using the chemically amplified resist pattern as a mask.

* * * * *

UNITED STATES PATENT AND TRADEMARK OFFICE
CERTIFICATE OF CORRECTION

PATENT NO. : 5,707,784
DATED : January 13, 1998
INVENTOR(S) : Akira OIKAWA, et al.

It is certified that error appears in the above-indentified patent and that said Letters Patent is hereby corrected as shown below:

<u>Column 1</u>

Line 54, after "group", insert --in a portion irradiated with ionizing radiation, and, for example, there is a material obtained by mixing a dissolution inhibitor (DI) for controlling alkali solubility and a photo-acid-generator (PAG) for generating an acid--.

<u>Column 3</u>

Line 53, after "resist", insert --2.--.

Signed and Sealed this

Twenty-third Day of June, 1998

Attest:

BRUCE LEHMAN

*Attesting Officer*  *Commissioner of Patents and Trademarks*